United States Patent
Murata (10) Patent No.: US 8,317,924 B2
(45) Date of Patent: Nov. 27, 2012

(54) GAS TREATMENT APPARATUS, GAS TREATMENT METHOD, AND STORAGE MEDIUM

(75) Inventor: Akira Murata, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 573 days.

(21) Appl. No.: 12/551,946

(22) Filed: Sep. 1, 2009

(65) Prior Publication Data

US 2010/0050867 A1    Mar. 4, 2010

(30) Foreign Application Priority Data

Sep. 3, 2008  (JP) ................................. 2008-226371

(51) Int. Cl.
*C23C 16/448*  (2006.01)
*C23C 16/00*  (2006.01)

(52) U.S. Cl. ...................................... 118/726; 118/712

(58) Field of Classification Search .................. None
See application file for complete search history.

(56) References Cited

U.S. PATENT DOCUMENTS

| | | | |
|---|---|---|---|
| 5,415,585 A | * | 5/1995 | Miyagi .......................... 454/187 |
| 6,224,681 B1 | * | 5/2001 | Sivaramakrishnan et al. .............................. 118/726 |

FOREIGN PATENT DOCUMENTS

| | | |
|---|---|---|
| JP | 7-263361 A | 10/1995 |
| JP | 2006-49798 A | 2/2006 |
| JP | 2006-253542 A | 9/2006 |

* cited by examiner

*Primary Examiner* — Dah-Wei Yuan
*Assistant Examiner* — Stephen Kitt
(74) *Attorney, Agent, or Firm* — Abelman, Frayne & Schwab (57) ABSTRACT

Disclosed is a gas treatment apparatus which can reduce the useless liquid quantity without using an expensive device, such as the evaporator or the mass flowmeter. The control mechanism performs control for exhausting the raw material storage container to make the raw material storage container have a predetermined vacuum pressure, stopping exhaustion to make the raw material storage container be in a sealed state, making the inside of the raw material storage container have the treatment gas atmosphere formed by gasifying the liquid raw material by the vacuum pressure within the raw material storage container, exhausting the chamber to make the chamber have a predetermined vacuum pressure in a state where the target substrate is received in the chamber, stopping the exhaustion to make the inside of the chamber be in a sealed state, opening the opening/closing valve to introduce the treatment gas from the raw material storage container to the chamber, and closing the opening/closing valve when the inside pressure of the chamber reaches a treatment pressure that is higher than the vacuum pressure and lower than a vapor pressure of the liquid raw material to make the chamber have the treatment gas atmosphere of the treatment pressure.

7 Claims, 5 Drawing Sheets

FIG.5

GAS TREATMENT APPARATUS, GAS TREATMENT METHOD, AND STORAGE MEDIUM

This application is based on, and claims priority from, Japanese Patent Application No. 2008-226371, filed on Sep. 3, 2008 with the Japanese Patent Office, the disclosure of which is incorporated herein in its entirety by reference.

TECHNICAL FIELD

The present disclosure relates to a gas treatment apparatus which treats a substrate using gas in a predetermined gas atmosphere, a gas treatment method and a storage medium storing a program for executing the treatment method.

BACKGROUND

In response to recent demands for a high-speed semiconductor device, fine wiring pattern, and high-integration, it has been necessary to decrease the capacity between the wirings, improve the conductivity of the wiring, and improve the electromigration resistance. In this respect, the Copper (Cu) multilayer wiring technology comes into the spotlight. In this technology, Copper with conductivity and electromigration resistance values higher than those of Aluminum (Al) or Tungsten (W) is used for a wiring material, and a low-k dielectric film is used for an interlayer insulating film. A low-k dielectric film having the alkyl group, such as the methyl group, as the end group is generally used, and a damascene process such as the dual damascene method is widely used for forming an wiring groove or a contact hole.

In the damascene process, the interlayer insulating film made of the low-k material is damaged in etching or removing the resist film, which causes the increase of the dielectric constant of the interlayer insulating film and thus deteriorates the effect of using the low-k material. Therefore, as for the technology of repairing the damage, performing a silylation treatment after etching or removing the resist film has been suggested. For example, a conventional silylation treatment is disclosed in Japanese Laid-open Patent Publication No. 2006-49798.

The silylation treatment is implemented by a silylation unit that gasifies liquid silylating agents at an indoor temperature to supply the gasified silylating agents into a chamber, and makes the inside of the chamber be a predetermined gas atmosphere. Further, the damaged portion of the low-k dielectric film formed on the target substrate is reformed through the silylation treatment to have the alkyl group, such as the methyl group, as the end group.

In the silylation unit, the flow quantity of the liquid silylating agents is controlled by a mass flowmeter to supply a certain quantity of the liquid silylating agents into an evaporator to heat the evaporator, and the silylating agents gasified in the evaporator are supplied into the vacuum-maintained chamber. As the inside of the chamber is vacuum pressurized, the silylating agents supplied into the chamber is completely gasified, and the exhaustion valve is closed so that the gas pressure in the chamber gradually increases. Further, the valve supplying the silylating agents is closed when the pressure within the chamber increases to the treatment pressure, and the inside of the chamber is filled with the gas-state silylating agents atmosphere that is maintained with the treatment pressure for a predetermined amount of time, so as to cause a silylation reaction.

However, in order to prevent dew condensation, the conventional silylation unit cannot raise the temperature of the evaporator so high, and there exists a liquid residual in the pipe, or the like. Further, the flow quantity of the silylating agents is controlled in the liquid state and therefore, the silylating agents are excessively supplied during the period from transmitting the valve-closing signal to actually closing the valve. Due to this, the conventional silylation unit causes the substantial quantity of the useless silylating agents to remain.

Further, the evaporator or mass flowmeter used in the conventional silylation unit is expensive and the cost of the apparatus is high.

Furthermore, such problems are not limited to the silylation unit, but can be generally incurred in the gas treatment apparatus which gasifies the liquid material by means of the evaporator to supply the gasified material into the chamber and makes the inside of the chamber be a gas atmosphere to treat the target substrate using gas.

SUMMARY

According to one embodiment, a gas treatment apparatus for treating a target substrate using treatment gas that is formed by gasifying a liquid material is provided. The gas treatment apparatus includes a raw material storage container to store the liquid raw material, a chamber to receive a target substrate and have a treatment gas atmosphere, a container exhaustion mechanism to exhaust the raw material storage container, a chamber exhaustion mechanism to exhaust the chamber, a connection tube to connect the raw material storage container and the chamber, an opening/closing valve mounted on the connection tube, a container pressure sensor to detect an inside pressure of the raw material storage container, a chamber pressure sensor to detect an inside pressure of the chamber, and a control mechanism to control the container exhaustion mechanism, the chamber exhaustion mechanism, and the opening/closing valve. The control mechanism performs control according to sequence including a first operation of exhausting the raw material storage container by means of the container exhaustion mechanism to make the raw material storage container have a first predetermined vacuum pressure, stopping exhaustion after the raw material storage container has the first predetermined vacuum pressure to make the raw material storage container be in a sealed state, and making the inside of the raw material storage container have the treatment gas atmosphere formed by gasifying the liquid raw material by the vacuum pressure within the raw material storage container, a second operation of exhausting the chamber by means of the chamber exhaustion mechanism to make the chamber have a second predetermined vacuum pressure in a state where the target substrate is received in the chamber, and stopping the exhaustion after the chamber has the second predetermined vacuum pressure to make the inside of the chamber be in a sealed state, a third operation of opening the opening/closing valve and introducing the treatment gas from the raw material storage container to the chamber, and a fourth operation of closing the opening/closing valve when the inside pressure of the chamber reaches a treatment pressure that is higher than the second predetermined vacuum pressure and lower than a vapor pressure of the liquid raw material to make the chamber have the treatment gas atmosphere of the treatment pressure.

The foregoing summary is illustrative only and is not intended to be in any way limiting. In addition to the illustrative aspects, embodiments, and features described above, fur-

DETAILED DESCRIPTION

In the following detailed description, reference is made to the accompanying drawing, which form a part hereof. The illustrative embodiments described in the detailed description, drawing, and claims are not meant to be limiting. Other embodiments may be utilized, and other changes may be made, without departing from the spirit or scope of the subject matter presented here.

The present disclosure provides a gas treatment apparatus and a gas treatment method which can reduce the useless liquid quantity without using an expensive device, such as the evaporator or the mass flowmeter. The present disclosure also provides a storage medium of storing a program that executes the gas treatment method.

According to one embodiment, a gas treatment apparatus for treating a target substrate using treatment gas that is formed by gasifying a liquid material is provided. The gas treatment apparatus includes a raw material storage container to store the liquid raw material, a chamber to receive a target substrate and have a treatment gas atmosphere, a container exhaustion mechanism to exhaust the raw material storage container, a chamber exhaustion mechanism to exhaust the chamber, a connection tube to connect the raw material storage container and the chamber, an opening/closing valve mounted on the connection tube, a container pressure sensor to detect an inside pressure of the raw material storage container, a chamber pressure sensor to detect an inside pressure of the chamber, and a control mechanism to control the container exhaustion mechanism, the chamber exhaustion mechanism, and the opening/closing valve. The control mechanism performs control according to sequence including a first operation of exhausting the raw material storage container by means of the container exhaustion mechanism to make the raw material storage container have a first predetermined vacuum pressure, stopping exhaustion after the raw material storage container has the first predetermined vacuum pressure to make the raw material storage container be in a sealed state, and making the inside of the raw material storage container have the treatment gas atmosphere formed by gasifying the liquid raw material by the vacuum pressure within the raw material storage container, a second operation of exhausting the chamber by means of the chamber exhaustion mechanism to make the chamber have a second predetermined vacuum pressure in a state where the target substrate is received in the chamber, and stopping the exhaustion after the chamber has the second predetermined vacuum pressure to make the inside of the chamber be in a sealed state, a third operation of opening the opening/closing valve and introducing the treatment gas from the raw material storage container to the chamber, and a fourth operation of closing the opening/closing valve when the inside pressure of the chamber reaches a treatment pressure that is higher than the second predetermined vacuum pressure and lower than a vapor pressure of the liquid raw material to make the chamber have the treatment gas atmosphere of the treatment pressure.

The container exhaustion mechanism includes a container exhaustion tube connected to the raw material storage container, an opening/closing valve mounted on the container exhaustion tube, and a vacuum pump connected to the container exhaustion tube. The chamber exhaustion mechanism includes a chamber exhaustion tube connected to the chamber, an opening/closing valve mounted on the chamber exhaustion tube, and a vacuum pump connected to the chamber exhaustion tube. The container exhaustion mechanism and the chamber exhaustion mechanism exhaust by opening the opening/closing valve in a state of operating the vacuum pump and make the insides of the raw material storage container and the chamber be in a sealed state by closing the opening/closing valve. In this case, the container exhaustion mechanism and the chamber exhaustion mechanism include a common vacuum pump. Further, the container exhaustion tube includes a needle valve mounted on a downstream side portion of the opening/closing valve. Furthermore, the chamber exhaustion mechanism includes a bypass tube to bypass the opening/closing valve, wherein the bypass tube includes an opening/closing valve and a needle valve mounted on the downstream side portion of the opening/closing valve.

After supplying the treatment gas to the chamber and closing the opening/closing valve mounted on the connection tube, the inside pressure of the raw material storage container increases due to the gasification of the stored liquid raw material so that the treatment of a next target substrate is performed by the control of the control mechanism according to the second operation through the fourth operation. Further, the control mechanism controls to repeat second operation through the fourth operation so as to sequentially perform the gas treatment for a plurality of target substrates.

The liquid raw material is silylating agents and the gas treatment is a silylation treatment for a target object.

According to another embodiment, a gas treatment method for treating a target substrate using treatment gas formed by gasifying a liquid raw material using a gas treatment apparatus including a raw material storage container to store a raw material, a chamber to receive a target substrate and having a treatment gas atmosphere, a connection tube to connect the raw material storage container and the chamber, and an opening/closing valve to open/close the connection tube is provided. The gas treatment method includes a first step of exhausting the raw material storage container to make the raw material storage container have a first predetermined vacuum pressure, stopping exhaustion after the raw material storage container has the first predetermined vacuum pressure to make the raw material storage container be in a sealed state, and making an inside of the raw material storage container have the treatment gas atmosphere formed by gasifying the liquid raw material by the first predetermined vacuum pressure within the raw material storage container, a second step of exhausting the chamber to make the chamber have a second predetermined vacuum pressure in a state where the target substrate is received in the chamber, and stopping the exhaustion after the chamber has the second predetermined vacuum pressure to make the inside of the chamber be in a sealed state, a third step of opening the opening/closing valve and introducing the treatment gas from the raw material storage container to the chamber, and a fourth step of closing the opening/ closing valve at the point of time when the inside pressure of the chamber reaches a treatment pressure that is higher than the second predetermined vacuum pressure and lower than a vapor pressure of the liquid raw material so as to make the chamber have the treatment gas atmosphere of the treatment pressure, in which the target substrate is subjected to the gas treatment within the chamber having the treatment gas atmosphere of the treatment pressure.

After supplying the treatment gas to the chamber and closing the opening/closing valve mounted on the connection tube, the inside pressure of the raw material storage container increases due to the gasification of the stored liquid raw material so that the treatment of a next target substrate is performed according to the second step through the fourth step. Then, by repeating the second step through the fourth step, the gas treatment is sequentially performed for a plurality of target substrates.

The liquid raw material is silylating agents and the gas treatment is a silylation treatment for a target object.

According to another embodiment, a storage medium storing a program operable on a computer for controlling a gas treatment apparatus. The storage medium includes a raw material storage container to store a liquid raw material, a chamber to receive a target substrate and have a treatment gas atmosphere, a connection tube to connect the raw material storage container and the chamber, and an opening/closing valve to open/close the connection tube. The program, when executed by the computer, controls the gas treatment apparatus to perform the gas treatment method According to the present disclosure, the raw material storage container is exhausted to a vacuum state by means of the tank exhaust mechanism to make the raw material storage container have the predetermined vacuum pressure, the exhaustion is stopped to make the raw material storage container be in a sealed state, and the inside of the raw material storage container comes to be filled with the treatment gas atmosphere that is formed by gasifying the liquid material by the vacuum pressure within the raw material storage container. Then, in the state where the target substrate is received in the chamber, the chamber is exhausted to a vacuum state by means of the chamber exhaustion mechanism to have the predetermined vacuum pressure, the exhaustion is stopped to make the inside of the chamber be in a sealed state, and subsequently, the opening/closing valve is opened so as to introduce the treatment gas from the raw material storage container to the chamber. Then, at the point of time when the pressure within the chamber reaches the treatment pressure that is higher than the vacuum pressure and is lower than the vapor pressure of the liquid raw material, the opening/closing valve is closed and the chamber comes to be filled with the treatment gas atmosphere of the treatment pressure. As a result, in the raw material storage container, the treatment gas gasified by the vacuum pressure is supplied into the chamber using the pressure difference, the treatment gas is used as much as the quantity of the liquid raw material that has been gasified in the raw material storage container, and there occurs no problems of the liquid residual or excessively supplying the liquid raw material. Therefore, it is possible to control the usage quantity of the silylating agents to be of a minimum quantity.

Further, the silylation treatment can be performed with the predetermined treatment pressure only with the valve operation based on the detection information of the pressure sensors without using the evaporator or mass flowmeter so that it is possible to decrease the cost of the apparatus.

Furthermore, once the raw material storage container has the vacuum pressure, the gasification of the liquid raw material progresses in the inside of the raw material storage container, and the inside of the raw material storage container is maintained with the vapor pressure. Therefore, even though the pressure decreases due to the supply of the gasified treatment gas into the chamber, the pressure is recovered again to the vapor pressure value, so that it is possible to sequentially perform the silylation treatment for a plurality of target substrates.

In the embodiment of the present disclosure, the capacity and treatment pressure of the raw material storage container may be appropriately set by controlling the pressure to supply the treatment gas into the chamber from the raw material storage container to perform the gas treatment with the predetermined treatment pressure.

Figure 1:
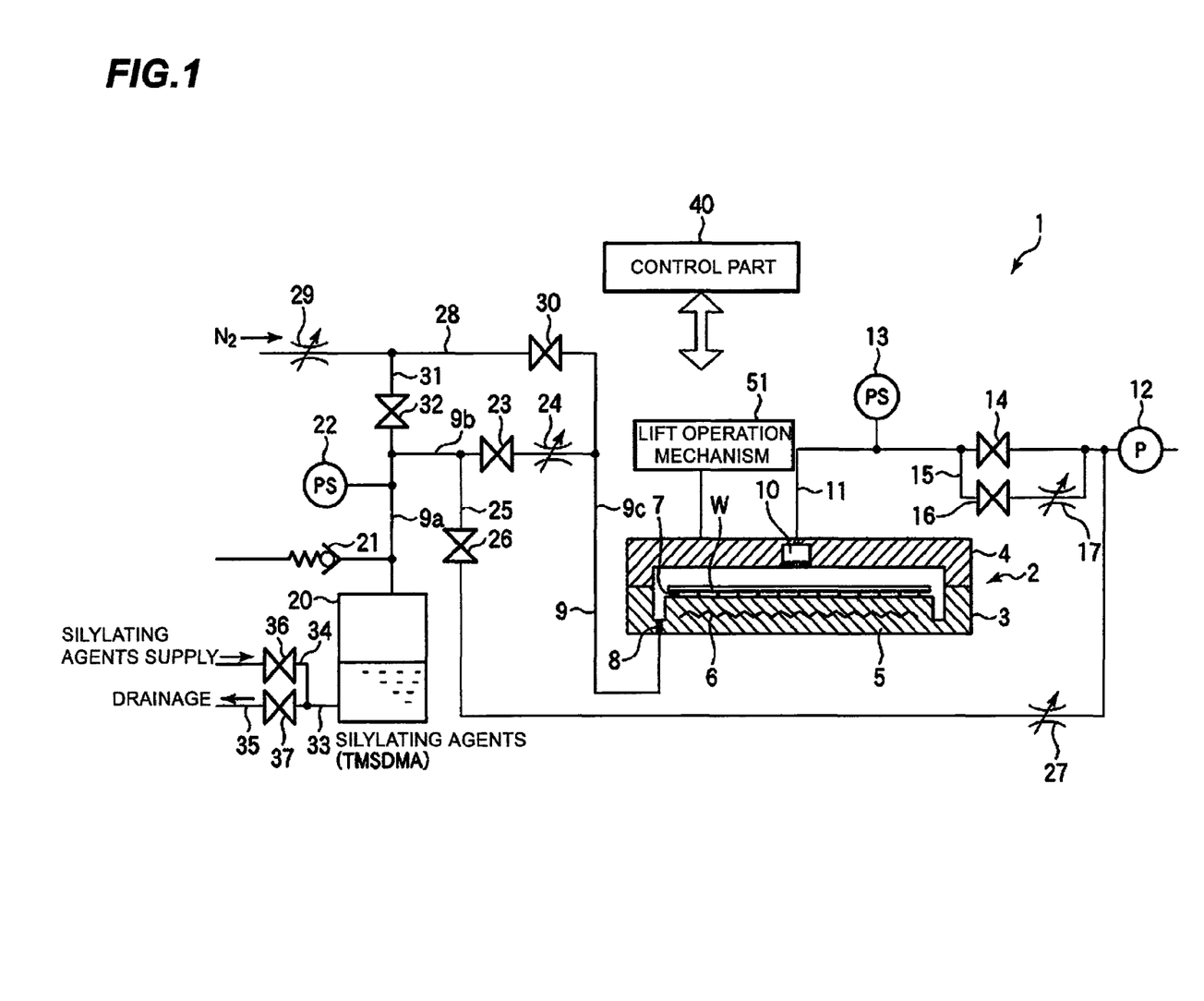
FIG. 1 is a schematic diagram illustrating a silylation apparatus according to one embodiment.

Hereinafter, exemplary embodiments of the present disclosure will be described with reference to the accompanying drawings. FIG. 1 is a schematic diagram illustrating a silylation apparatus according to one embodiment of the present disclosure.

A silylation apparatus 1 includes a chamber 2 accommodating a semiconductor wafer W (hereinafter, referred to as "the wafer") that is a target substrate, and chamber 2 includes a fixed lower-side housing 3 and a cover 4 for covering an upper side of lower-side housing 3. Cover 4 can ascend and descend by means of a lift operation mechanism 51. By descending cover 4, lower-side housing 3 and cover 4 are closely sealed by means of a seal member (not shown) so as to form chamber 2 that can maintain the vacuum state. Further, when wafer W is loaded in and unloaded from the inside of chamber 2, cover 4 becomes the ascended state by means of lift operation mechanism 51.

Lower-side housing 3 includes a hot plate 5 and a plurality of pins 7 for supporting wafer W are provided at the upper surface of lower-side housing 3. Further, a heater 6 is embedded in hot plate 5, and through applying an electric current to heater 6, it is possible to heat wafer W laid on pins 7 at a predetermined temperature, e.g. 200° C. or lower. Further, a lift pin (not shown) that can be protruded and depressed is provided at hot plate 5 and by means of the lift pin, wafer W can ascend and descend during loading and unloading wafer W.

A gas introduction port 8 is arranged in the outer side of hot plate 5 in the bottom part of lower-side housing 3, and a silylating agents supply tube 9 for supplying the silylating agents into chamber 2 is connected to gas introduction port 8.

An exhaust port 10 is arranged in the center of cover 4 and a chamber exhaustion tube 11 for exhausting the inside of chamber 2 to a vacuum state is connected to exhaust port 10. A vacuum pump 12 is connected to chamber exhaustion tube 11, and through the operation of vacuum pump 12, it is possible to maintain the inside of chamber 2 with a predetermined vacuum pressure. A pressure sensor 13 for detecting the pressure within chamber 2 and an opening/closing valve 14 are mounted on chamber exhaustion tube 11 from the upstream side. A bypass tube 15 is connected to chamber exhaustion tube 11 for bypassing opening/closing valve 14. An opening/closing valve 16 and a needle valve 17 are installed in bypass tube 15 from the upstream side. Further, the air is exhausted via chamber exhaustion tube 11 by opening opening/closing valve 14 and by closing opening/closing valve 16, while the air is exhausted via bypass tube 15 by closing opening/closing valve 14 and opening opening/closing valve 16. However, since needle valve 17 is installed in bypass tube 15, it is possible to exhaust the air via bypass tube 15 at a low speed. Due to this, chamber exhaustion tube 11 functions as a high-speed exhaust line and bypass tube 15 functions as a low-speed exhaust line.

A silylating agents storage tank 20 is disposed on the outside of chamber 2 and stores the silylating agents, e.g. TMSDMA (Dimethylaminotrimethylsilane), in a liquid state. A ceiling wall of silylating agents storage tank 20 is connected with an end of a silylating agents supply tube 9. Silylating agents supply tube 9 includes a front end 9a upwardly extending from silylating agents storage tank 20, a middle end 9b horizontally extending from front end 9a, and a rear end 9c downwardly extending from middle end 9b and connected to gas introduction port 8. A relief valve 21 and a pressure sensor 22 for detecting the pressure within silylating agents storage tank 20 are mounted on front end 9a from the upstream side, and an opening/closing valve 23 and a needle valve 24 are mounted on middle end 9b from the upstream side. A tank exhaustion tube 25 for exhausting the inside of silylating agents storage tank 20 to a vacuum state is connected to the upstream side portion of opening/closing valve 23 in middle end 9b, and the other end of tank exhaustion tube 25 is connected to the downstream side of chamber exhaustion tube 11 lower than the confluence portion of bypass tube 15. An opening/closing valve 26 and a needle valve 27 are mounted on tank exhaustion tube 25 from the upstream side, such that needle valve 27 prevents the inside of silylating agents storage tank 20 from being rapidly exhausted when opening opening/closing valve 26.

A N2 gas tube 28 for purging the inside of chamber 2 is connected to rear end 9c of silylating agents supply tube 9. A needle valve 29 and an opening/closing valve 30 are mounted on N2 gas tube 28 from the upstream side. Further, by closing opening/closing valve 23 and opening opening/closing valve 30 of silylating agents supply tube 9, it is possible to supply N2 gas into chamber 2 to purge the inside of chamber 2.

A liquid extraction tube 31 for extracting the liquid state silylating agents within silylating agents storage tank 20 is branched from N2 gas tube 28, and liquid extraction tube 31 is connected to front end 9a of silylating agents supply tube 9. Liquid extraction tube 31 is provided with an opening/closing valve 32, and by opening opening/closing valve 32, N2 gas that serves as the carrier gas for the liquid extraction is supplied into silylating agents storage tank 20 from N2 gas tube 28 via liquid extraction tube 31 and front end 9a of silylating agents supply tube 9.

A tube 33 is connected to a lower portion of silylating agents storage tank 20, and a silylating agents supply tube 34 and a drainage tube 35 are connected to tube 33. Further, an opening/closing valve 36 is mounted on silylating agents supply tube 34 and an opening/closing valve 37 is mounted on drainage tube 35. By opening opening/closing valve 36 and closing opening/closing valve 37, the silylating agents are supplied into silylating agents storage tank 20 via silylating agents supply tube 34 and tube 33. Further, by closing opening/closing valve 36 and opening opening/closing valve 37, the silylating agents in silylating agents storage tank 20 is drained by N2 gas carrying via tube 33 and drainage tube 35. Further, a relief valve 21 is used as the safety means when draining by gas carrying.

Figure 2:
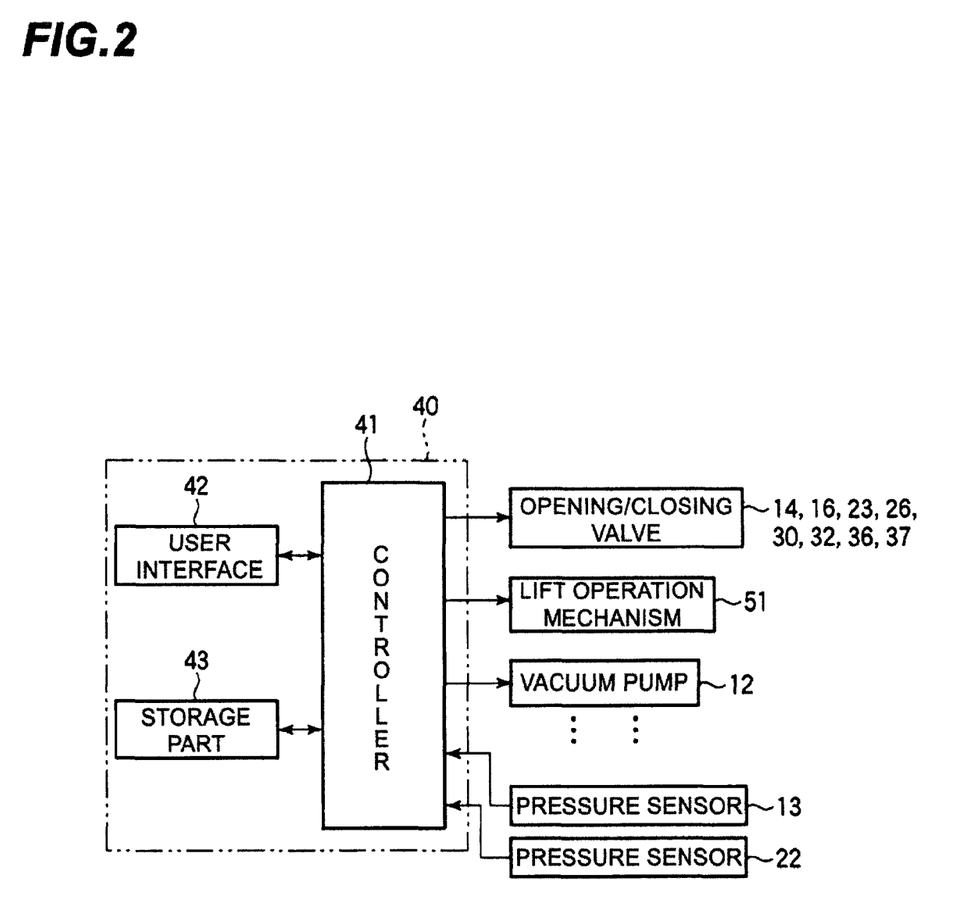
FIG. 2 is a block diagram illustrating a control part of the gas treatment apparatus of FIG. 1.

Silylating apparatus 1 includes a control part 40. Control part 40, as shown in FIG. 2, includes a controller 41, a user interface 42, and a storage part 43. Controller 41 controls each constructional element of silylating apparatus 1, e.g. opening/closing valves 14, 16, 23, 26, 30, 32, 36, and 37, lift operation mechanism 51 for ascending and descending cover 4, vacuum pump 12, or the like. Further, the controller receives a pressure detection value of pressure sensors 13 and 22 as information for controlling the opening/closing of the opening/closing valves. Further, a user interface 42 accesses controller 41, and includes a keyboard for the operation, such as command input, for managing silylating apparatus 1 by an operator, a display for visually displaying the operation status of silylating apparatus 1, or the like. A storage part 43 accesses controller 41 and stores a control program for controlling a target object of the respective constructional elements of silylating apparatus 1 and a program for executing the predetermined treatment in silylating apparatus 1, i.e. a treatment recipe. The treatment recipe is stored in a storage medium in storage part 43. The storage medium may be the fixed medium, such as a hard disc, and the transferable medium, such as CDROM, DVD, flash memory, or the like. Further, it is possible to appropriately transmit the recipe from another apparatus, e.g. via the private line. Further, controller 41 calls a certain treatment recipe from storage part 43 by commands from user interface 42 and executes the recipe depending on the necessity, so as to perform the predetermined treatment under the control of controller 41.

Figure 3:
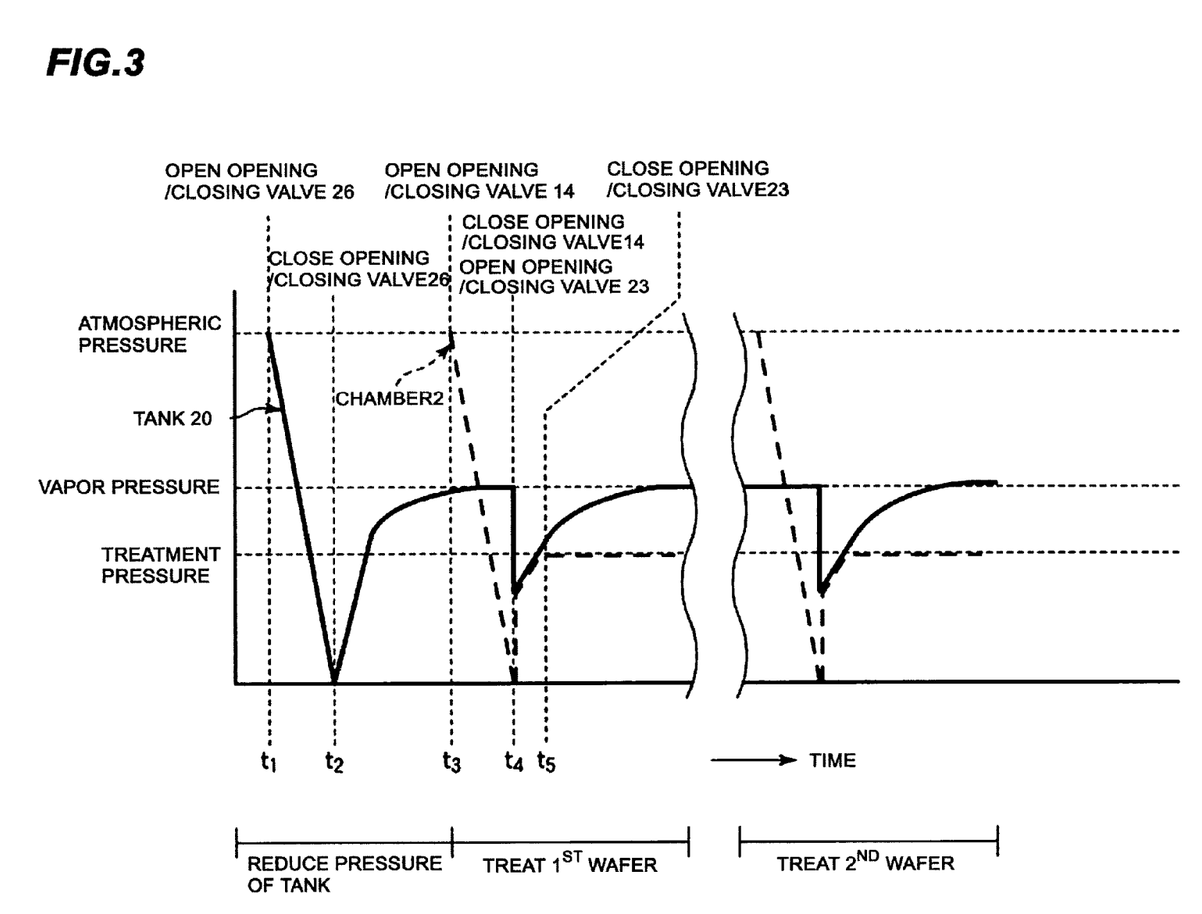
FIG. 3 is a diagram illustrating a treatment sequence in the silylation treatment by means of the silylation apparatus of FIG. 1.

Next, the treatment sequence of the silylation treatment of wafer W by silylating apparatus 1 will be described with reference to FIG. 3. Further, the treatment sequence is executed by controlling the respective constructional elements of the apparatus by controller 41 based on the predetermined treatment recipe of storage part 43 of control part 40.

First, a predetermined quantity of the silylating agents (TMSDMA) is stored in silylating agents storage tank 20 and a first wafer W is loaded into chamber 2 in the state where all the opening/closing valves are closed. With respect to loading wafer W, cover 4 of chamber 2 ascends by means of lift operation mechanism 51 and wafer W is carried into chamber 2 by means of a carrying arm (not shown), so as to lay wafer W on a lift pin (not shown) that protrudes from hot plate 5. Subsequently, the carrying arm is recessed from chamber 2 and the lift pin descends so as to lay wafer W on the pin 7. Then, cover 4 descends by means of lift operation mechanism 51 so as to make the inside of chamber 2 be a closely sealed space.

Next, the inside of silylating agents storage tank 20 is subjected to the decompressing treatment. In the decompressing treatment, opening/closing valve 26 is first opened and the deaeration of the inside of silylating agents storage tank 20 is started by vacuum pump 12 (t1 of FIG. 3). At this time, it is preferred that the exhaust speed is lowered by needle valve 27 to prevent the splashing of the liquid silylating agents caused by the rapid decompression. Through the decompressing treatment, the inside pressure of silylating agents storage tank 20 is reduced, and at the point of time when the inside of tank 20 reaches the predetermined vacuum pressure, e.g., 1 Torr (133.3 Pa) (t2 of FIG. 3), opening/closing valve 26 is closed. By the decompressing treatment, the inside air of silylating agents storage tank 20 is exhausted.

As the inside of silylating agents storage tank 20 is sealed in the state where opening/closing valve 26 is closed, the inside pressure of silylating agents storage tank 20 increases while gasifying of the silylating agents and the pressure becomes saturated to be the vapor pressure of the silylating agents.

Then, after finishing the decompressing treatment of silylating agents storage tank 20, the first wafer W is subjected to the silylation treatment. First, opening/closing valve 14 is opened at a predetermined time, e.g. when the inside pressure of silylating agents storage tank 20 reaches the vapor pressure of the silylating agents, and the inside of chamber 2 is exhausted by means of vacuum pump 12 (t3 of FIG. 3) to a vacuum state. As a result, the inside pressure of chamber 2 decreases, and at a point of time (t4 of FIG. 3) where the inside pressure of chamber 2 reaches the predetermined vacuum pressure, e.g. 1 Torr (133.3 Pa), opening/closing valve 14 is closed and opening/closing valve 23 is opened.

Accordingly, the inside of silylating agents storage tank 20 is connected with the inside of chamber 2, and the silylating agents steam is supplied into the chamber having a lower pressure from silylating agents storage tank 20 with the vapor pressure of the silylating agents, which decreases the inside pressure of silylating agents storage tank 20 and increases the inside pressure of chamber 2 so that the inside pressure of silylating agents storage tank 20 and chamber 2 comes to have the identical pressure value. Further, the silylating agents within silylating agents storage tank 20 is gasified to more increase the inside pressures of silylating agents storage tank 20 and chamber 2. Then, opening/closing valve 23 is closed at a point of time (t5 of FIG. 3) where the inside pressures of silylating agents storage tank 20 and chamber 2 reach the treatment pressure that is lower than the vapor pressure of the silylating agents. As a result, the inside of chamber 2 is maintained with the treatment pressure so that the silylation treatment of the first wafer W is started. At this time, inside pressure of silylating agents storage tank 20 more increases and is saturated at the point of time when the inside pressure reaches up to the vapor pressure of the silylating agents to prepare the silylation treatment of the next wafer. Here, it is preferred that the treatment pressure of the silylation treatment is lower than the vapor pressure of the silylating agents, and the inside vacuum pressure of chamber 2 prior to supplying the silylating agents is lower than the treatment pressure.

Needle valve 24 is provided for preventing the rapid pressure variation when opening opening/closing valve 23. Alternatively, it does not include needle valve 24 if there are no such concerns.

After the silylation treatment is performed for a predetermined time, chamber 2 is exhausted and N2 purged so as to make the inside of chamber 2 be the state of actually including no silylating agents. Next, the inside of chamber 2 is restored to the atmospheric pressure and then cover 4 of chamber 2 descends by means of lift operation mechanism 51 so as to unload the first wafer W from chamber 2 and load a second wafer to chamber 2. At this time, the inside pressure of silylating agents storage tank 20 is already the vapor pressure of the silylating agents, and therefore it does not require the decompressing treatment of the silylating agents storage tank. Therefore, the treatment of the second wafer W starts with the opening of opening/closing valve 14 and exhausting the inside of chamber 2 to a vacuum state. Thereafter, the treatment of the second wafer W follows the sequence completely identical to that of the treatment of the first wafer W. Further, with respect to the treatment from the third wafer W, the silylation treatment also follows the sequence completely identical to that of the treatment of the second wafer W.

If the TMSDMA is used as the silylating agents, the vapor pressure at an indoor temperature (20° C.) is 78.8 Torr (10.5 kPa) and the treatment pressure is set as the pressure lower than the vapor pressure, e.g. 55 Torr (7331.5 Pa).

Figure 4:
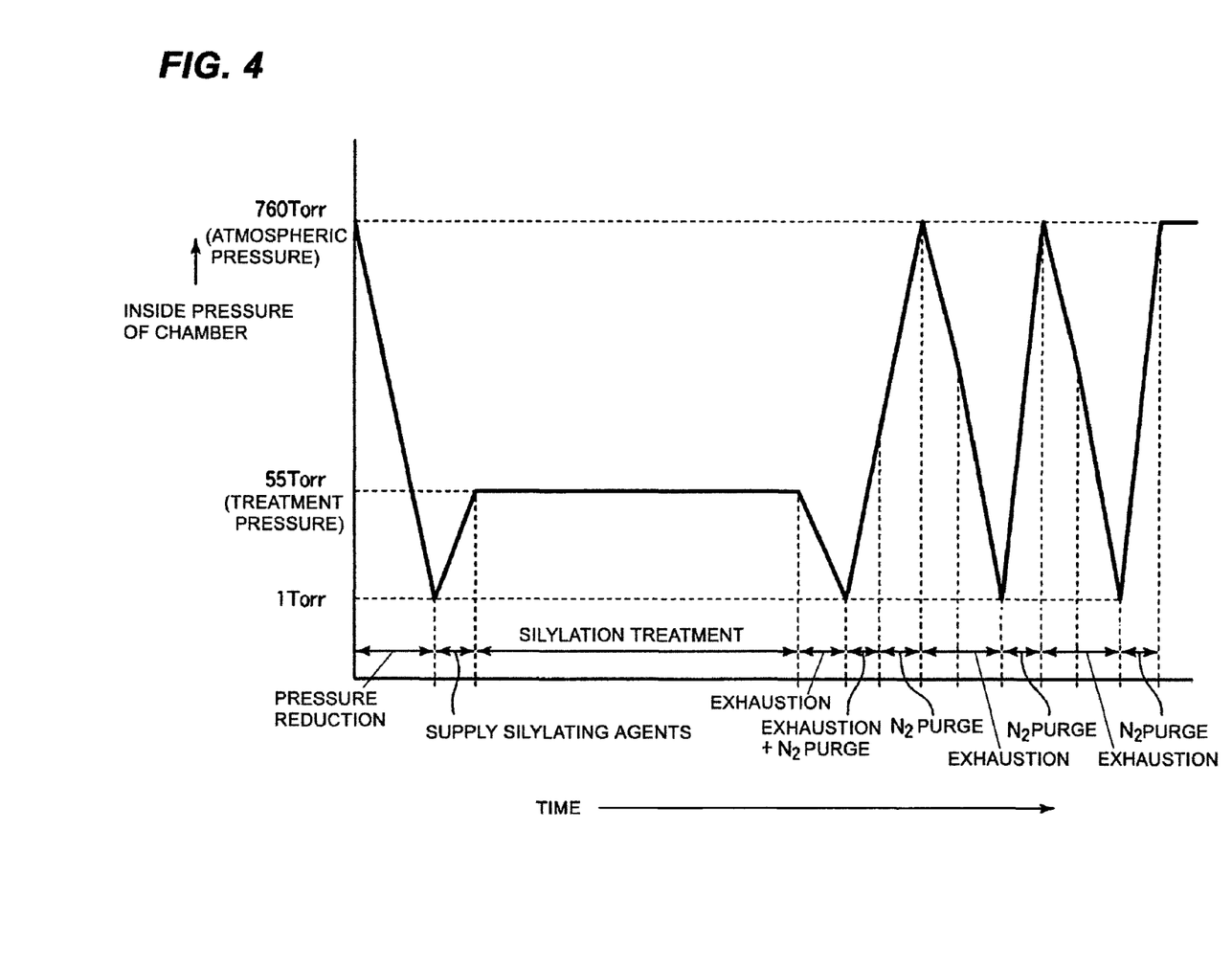
FIG. 4 is a diagram illustrating an example of a sequence of the silylation treatment including the exhaustion.

Next, the example of the silylation treatment sequence including the exhaustion will be described with reference to FIG. 4 in detail. Herein, the TMSDMA is used as the silylating agents, and the vacuum pressure is 1 Torr and the treatment pressure is 55 Torr. First, opening/closing valve 14 is opened and chamber 2 of 760 Torr of the atmospheric pressure is exhausted to a vacuum state. When the vacuum pressure reaches 1 Torr, opening/closing valve 14 is closed and opening/closing valve 23 is opened as described above to supply the TMSDMA of the silylating agents into chamber 2. Then, opening/closing valve 23 is closed at the point of time when the inside pressure of chamber 2 reaches 55 Torr that is the treatment pressure and the inside of chamber 2 is maintained with the treatment pressure to start the silylation treatment. That is, TMSDMA atmosphere of 55 Torr, which corresponds to the treatment pressure, is formed within chamber 2, so as to cause the silylating reaction on the surface of the damaged low-k dielectric film existing on wafer W within chamber 2. As a result, the portion that has the OH-group as the end group due to the damage is reformed, and thus the end group turns to the methyl group, or the like.

After performing the silylation treatment for a predetermined time, opening/closing valve 14 or 16 is opened to exhaust the inside of chamber 2. Then, opening/closing valve 30 is opened while exhausting the inside of chamber 2 and the N2 gas is supplied into chamber 2 to purge the inside of chamber 2. Next, opening/closing valve 14 or 16 switches to be closed, while purging only the N2 gas, and the inside pressure of chamber 2 increases. Subsequently, opening/closing valve 30 is closed at the point of time when the inside of chamber 2 becomes the atmospheric pressure and opening/closing valve 14 or 16 is opened to exhaust the inside of chamber 2 to a vacuum state again. Then, the inside of chamber 2 is subjected to the purge and vacuum exhaustion by the N2 gas one more time, and the N2 gas is finally supplied into chamber 2 so as to make the inside of chamber 2 be the atmospheric pressure. In this state, cover 4 ascends by means of lift operation mechanism 51 so as to be open to atmosphere and thus replace wafer W.

The condition at this time is different depending on the material, pattern, or the like, of the silylating agents or low-k dielectric film, but sample conditions except for the above pressure conditions is introduced below.

Treatment time period: 150 sec
Temperature of the hot plate: 120☐~160☐
TMSDMA supply volume: 0.21 mL/wafer
TMSDMA temperature: indoor temperature
Chamber capacity: 500 mL
N2 gas flow quantity: 6 L/min The time period from starting the vacuum exhaustion of chamber 2 to starting the silylation treatment is, for example, about 10 sec to 15 sec, and the time period from finishing the silylation treatment to opening chamber 2 to atmosphere is, for example, about 40 sec to 45 sec.

After performing such silylation treatment for the predetermined number of wafers W, the silylating agents remained within silylating agents storage tank 20 is drained to empty silylating agents storage tank 20. In this case, opening/closing valves 32 and 37 are opened and the silylating agents within silylating agents storage tank 20 are collected by the N2 gas carrying via tube 33 and drainage tube 35.

When supplying the silylating agents into silylating agents storage tank 20, opening/closing valve 36 is opened while closing opening/closing valve 37 and the silylating agents are supplied to silylating agents storage tank 20 via silylating agent supply tube 34 and tube 33 by means of an appropriate means, such as the gas carrying or gas pump.

In this embodiment, in a state where the silylating agents are stored in silylating agents storage tank 20 as described above, the inside of silylating agents storage tank 20 is filled with the vapor pressure atmosphere of the silylating agents. Thereafter, opening/closing valve 14 or 16 is opened to make the inside of chamber 2 have vacuum pressure, and then opening/closing valve 14 or 16 is closed and opening/closing valve 23 is opened so that the silylating agents steam is supplied from silylating agents storage tank 20 having a high pressure to chamber 2 having a low pressure. At the point of time when chamber 2 has the treatment pressure that is lower than the vapor pressure of the silylating agents, the opening/ closing valve is closed and wafer W is subjected to the silylation treatment while maintaining the inside of chamber 2 with the treatment pressure. As a result, as the silylating agents gasified by the vacuum pressure within the silylating agent storage tank 20 can be supplied into chamber 2 using the pressure difference, the silylating agents of gasified quantity are used and there does not occur a problem of liquid residual or an excessive supply of the silylating agents. Therefore, it is possible to control the usage quantity of the silylating agents to be of a minimum quantity.

The silylation treatment can be performed while maintaining the inside of chamber 2 with the predetermined treatment pressure only with the valve operation based on the detection information of pressure sensors 13 and 22 without using the evaporator or mass flowmeter so that it is possible to decrease the cost of the apparatus.

Once silylating agents storage tank 20 has the vacuum pressure, the gasification of the liquid silylating agents progresses in the inside of silylating agents storage tank 20 and the inside of silylating agents storage tank 20 is maintained with the vapor pressure. Therefore, even though the pressure decreases due to the supply of the gasified silylating agents into chamber 2, the pressure is recovered again to the vapor pressure levels so that it is possible to sequentially perform the silylation treatment for the plurality of wafers W.

In the conventional silylating apparatus using the evaporator, the silylating agents are gasified by heating to generate dew condensation in the tube when the temperature decreases, so that the strict control of the temperature of the tube is required. However, in this embodiment, as the silylating agents are gasified by the vacuum pressure and the gasified silylating agents are supplied into chamber 2 having a lower pressure, there is no concern of generating dew condensation in the tube, or the like.

Figure 5:
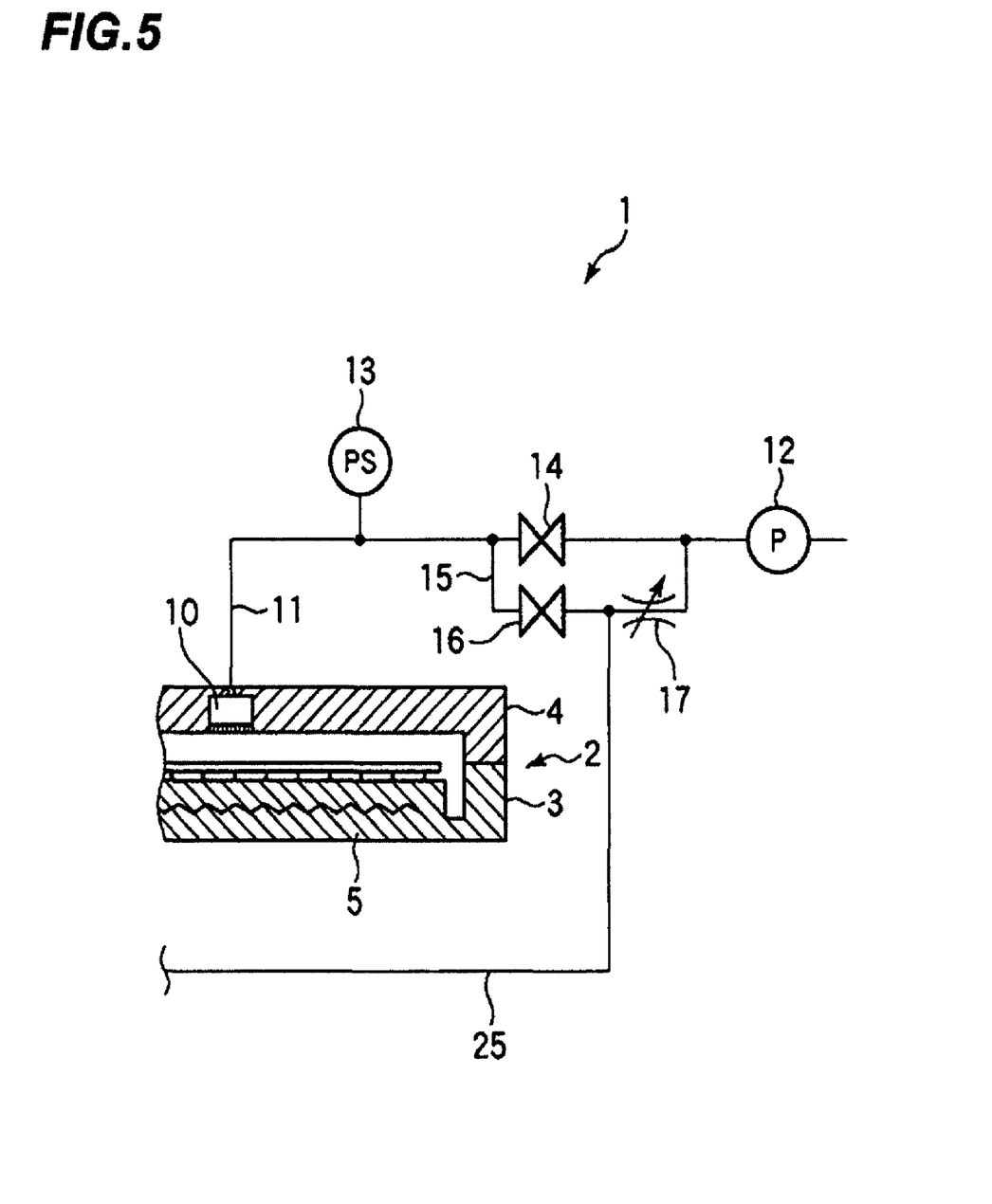
FIG. 5 is a diagram illustrating the main parts of the modified embodiment of the gas treatment apparatus of FIG. 1.

The present invention is not limited to the embodiment, but can be variously modified. For example, in this embodiment, tank exhaustion tube 25 for exhausting the inside of silylating agents storage tank 20 is connected to the downstream side lower than the confluence portion of bypass tube 15. Alternatively, as shown in FIG. 5, tank exhaustion tube 25 may be connected between opening/closing valve 16 of bypass tube 15 and needle valve 17. In this event, needle valve 27 can be omitted. Further, in this embodiment, the exhaustion tube of chamber 2 includes two types of tubes for high speed exhausting and low speed exhausting, and high speed exhausting and low speed exhausting may be used depending on the situation, but either can be used. Further, in this embodiment, the exhaustion of silylating agents storage tank 20 and chamber 2 is performed commonly using vacuum pump 12. Alternatively, it may use the respective vacuum pumps. Further, one silylating agents storage tank 20 may supply the gasified silylating agents into a plurality of chambers 2.

If there is a concern of a decrease in the temperature of the raw material storage container due to heat occurring when gasifying the raw material, an appropriate temperature control mechanism may be installed in the raw material storage container so as to control the temperature of the inside of the raw material storage container.

In this embodiment, the TMSDMA is used as the silylating agents as an example, but DMSDMA (Dimethylsilyldimethylamine), TMDS (1,1,3,3-Tetramethyldisilazane), TMSPyrole (1-Trimethylsilylpyrole), BSTFA (N, O-Bis (trimethylsilyl)trifluoroacetamide), BDMADMS [Bis(dimethylamino)dimethylsilane] may be used for the silylating agents.

The present disclosure is not limited to the treatment using the silylating agents, but is applicable to the case where the gas treatment is performed by gasifying the liquid state.

In this embodiment, the semiconductor wafer is applied to the target substrate. However, the present disclosure is not limited thereto, but can be applied to another substrate, such as the substrate for the flat panel display device, e.g. the glass substrate for the liquid crystal display.

From the foregoing, for the purpose of the present disclosure, it will be appreciated that the various embodiments of the present disclosure have been described herein for purposes of illustration, and that various modifications may be made without departing from the scope and spirit of the present disclosure. Accordingly, the various embodiments disclosed herein are not intended to limit the true scope and spirit of the disclosure indicated by the following claims.

What is claimed is:

1. A gas treatment apparatus for treating a target substrate using a treatment gas that is formed by gasifying a liquid raw material, the gas treatment apparatus comprising:
a raw material storage container configured to store a liquid raw material;
a chamber configured to receive a target substrate and have a treatment gas atmosphere;
a container exhaustion mechanism configured to exhaust the raw material storage container including a container exhaustion tube connected to the raw material storage container and a container valve connected to the container exhaustion tube;
a chamber exhaustion mechanism configured to exhaust the chamber including chamber exhaustion tube connected to the chamber and a chamber valve connected to the chamber exhaustion tube;
a connection tube configured to connect the raw material storage container and the chamber including a connection valve;
a container pressure sensor configured to detect an inside pressure of the raw material storage container;
a chamber pressure sensor configured to detect an inside pressure of the chamber; and
a control mechanism configured to control an overall operation of the container valve, the chamber valve, and the connection valve, to sequentially conduct,
a first operation in which the container valve remains open until the container pressure sensor senses a predetermined first pressure, and then the container valve is closed after sensing the predetermined first pressure;
a second operation in which the chamber valve remains open until the chamber pressure sensor senses a predetermined second pressure by accommodating a substrate in the chamber and then the chamber valve is closed after sensing the predetermined second pressure;
a third operation in which the connection valve is opened; and
a fourth operation in which the connection valve is closed when the chamber pressure sensor senses a processing pressure which is higher than the predetermined second pressure but lower than a vapor pressure of the liquid raw material.

2. The gas treatment apparatus of claim 1, wherein the container exhaustion mechanism and the chamber exhaustion mechanism include a common vacuum pump.

3. The gas treatment apparatus of claim 1, wherein the container exhaustion tube comprises a needle valve mounted on a downstream side of the container valve.

4. The gas treatment apparatus of claim 1, wherein the chamber exhaustion mechanism comprises a bypass tube to bypass the chamber valve, wherein the bypass tube comprises a bypass valve and a needle valve mounted on the downstream side of the bypass valve.

5. The gas treatment apparatus of claim 1, wherein, after supplying the treatment gas to the chamber and closing the connection valve mounted on the connection tube, the inside pressure of the raw material storage container increases due to the gasification of the stored liquid raw material so that the treatment of a next target substrate is performed by the control of the control mechanism according to the second operation through the fourth operation.

7. The gas treatment apparatus of claim 1, wherein the liquid raw material is silylating agents and the gas treatment is a silylation treatment for a target object.

6. The gas treatment apparatus of claim 5, wherein the control mechanism controls to repeat the second operation through the fourth operation so as to sequentially perform the gas treatment for a plurality of target substrates.

* * * * *